US012721190B2

(12) United States Patent
Ahn et al.

(10) Patent No.: US 12,721,190 B2
(45) Date of Patent: Aug. 25, 2026

(54) SEMICONDUCTOR PACKAGE

(71) Applicant: Samsung Electronics Co., Ltd., Suwon-si (KR)

(72) Inventors: Seok Geun Ahn, Suwon-si (KR); Seokhyun Lee, Suwon-si (KR); Yanggyoo Jung, Suwon-si (KR); Hwanyoung Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 581 days.

(21) Appl. No.: 18/299,927

(22) Filed: Apr. 13, 2023

(65) Prior Publication Data

US 2024/0063129 A1 Feb. 22, 2024

(30) Foreign Application Priority Data

Aug. 22, 2022 (KR) ........................ 10-2022-0104934

(51) Int. Cl.

| | |
|---|---|
| ***H01L 23/538*** | (2006.01) |
| ***H01L 23/00*** | (2006.01) |
| ***H01L 23/498*** | (2006.01) |
| ***H10B 80/00*** | (2023.01) |
| ***H10W 70/60*** | (2026.01) |
| ***H10W 70/63*** | (2026.01) |
| ***H10W 70/685*** | (2026.01) |

(Continued)

(52) U.S. Cl.

CPC .......... *H10W 70/611* (2026.01); *H10B 80/00* (2023.02); *H10W 70/635* (2026.01); *H10W 70/685* (2026.01); *H10W 74/131* (2026.01); *H10W 90/401* (2026.01); *H10W 90/701* (2026.01); *H10W 90/724* (2026.01)

(58) Field of Classification Search

None

See application file for complete search history.

(56) References Cited

U.S. PATENT DOCUMENTS

| | | | |
|---|---|---|---|
| 8,581,402 | B2 | 11/2013 | Yu et al. |
| 9,337,120 | B2 | 5/2016 | Li et al. |
| 9,576,933 | B1 | 2/2017 | Lo |

(Continued)

FOREIGN PATENT DOCUMENTS

| | | |
|---|---|---|
| KR | 10-2021-0004830 A | 1/2021 |

*Primary Examiner* — Lawrence C Tynes, Jr.

(74) *Attorney, Agent, or Firm* — Wolf, Greenfield & Sacks, P.C.

(57) ABSTRACT

A semiconductor package includes a package substrate, an interposer substrate on the package substrate, first connection bumps between the package substrate and the interposer substrate, first and second semiconductor chips on the interposer substrate, second connection bumps between the interposer substrate and the first and second semiconductor chips, and an upper molding layer on the interposer substrate and at least partially surrounding the first semiconductor chip and the second semiconductor chip. The interposer substrate includes a plurality of sub-interposers horizontally spaced apart from each other and each including through electrodes, a lower molding layer in a space between the sub-interposers, and a redistribution layer electrically connected to the through electrodes on the sub-interposers and the lower molding layer. A sum of areas of the sub-interposers is less than a sum of areas of the first and second semiconductor chips.

18 Claims, 12 Drawing Sheets

(51) Int. Cl.
*H10W 74/10* (2026.01)
*H10W 90/00* (2026.01)

(56) References Cited

U.S. PATENT DOCUMENTS

| | | | | |
|---|---|---|---|---|
| 10,529,689 | B2 | 1/2020 | Shih | |
| 10,930,592 | B2 | 2/2021 | Kim et al. | |
| 11,217,563 | B2 | 1/2022 | Zhai | |
| 2016/0056126 | A1* | 2/2016 | Yu | H01L 24/14<br>257/737 |
| 2018/0108540 | A1 | 4/2018 | Phee et al. | |
| 2018/0204791 | A1* | 7/2018 | Chen | H01L 25/0652 |
| 2020/0185357 | A1* | 6/2020 | Byun | H01L 25/0652 |
| 2022/0084947 | A1 | 3/2022 | Kim et al. | |

* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2022-0104934, filed on Aug. 22, 2022 in the Korean Intellectual Property Office, the disclosure of which is hereby incorporated by reference in its entirety.

BACKGROUND

The present inventive concepts relate to a semiconductor package, and more particularly, to a semiconductor package including an interposer substrate and a method of fabricating the same.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board.

With the development of electronic industry, electronic products have increasing demands for high performance, high speed, and compact size. To meet the trend, there has recently been developed a packaging technology in which a plurality of semiconductor chips are mounted in a single package. When a number of semiconductor packages are formed into a single package, an interposer may be provided to electrically connect the semiconductor packages to each other. The interposer may connect the semiconductor packages to each other and may increase the freedom of wiring of the semiconductor packages.

SUMMARY

Some embodiments of the present inventive concepts provide a semiconductor package having an increased yield.

However, the object of the present inventive concepts is not limited to that mentioned above, and other objects which have not been mentioned above will be clearly understood to those skilled in the art from the following description.

According to some embodiments of the present inventive concepts, a semiconductor package may include: a package substrate; an interposer substrate on the package substrate; first connection bumps between the package substrate and the interposer substrate, the first connection bumps connecting the interposer substrate to the package substrate; a first semiconductor chip and a second semiconductor chip horizontally spaced apart from each other on the interposer substrate; second connection bumps between the interposer substrate and the first and second semiconductor chips, the second connection bumps connecting the first and second semiconductor chips to the interposer substrate; and an upper molding layer on the interposer substrate, the upper molding layer at least partially surrounding the first semiconductor chip and the second semiconductor chip. The interposer substrate may include: a plurality of sub-interposers horizontally spaced apart from each other and each including through electrodes extending therethrough; a lower molding layer in a space between the sub-interposers; and a redistribution layer electrically connected to the through electrodes on the sub-interposers and the lower molding layer. A sum of areas of the sub-interposers may be less than a sum of an area of the first semiconductor chip and an area of the second semiconductor chip.

According to some embodiments of the present inventive concepts, a semiconductor package may include: a substrate including sub-interposers, a lower molding layer, and a redistribution layer; first connection bumps on a bottom surface of the substrate; and a first semiconductor chip and a second semiconductor chip mounted on the substrate and horizontally spaced apart from each other. The lower molding layer may be in spaces between the sub-interposers that are horizontally spaced apart from each other. Top surfaces of the sub-interposers may be exposed at a top surface of the lower molding layer. Bottom surfaces of the sub-interposers may be exposed at a bottom surface of the lower molding layer. The redistribution layer may cover the top surfaces of the sub-interposers and the top surface of the lower molding layer. Each of the sub-interposers may include through electrodes that vertically penetrate the sub-interposer and are coupled to the redistribution layer. A horizontal spacing between the first semiconductor chip and the second semiconductor chip may be in a range of about 1 μm to about 200 μm.

According to some embodiments of the present inventive concepts, a semiconductor package may include: a package substrate; an interposer substrate on the package substrate, the interposer substrate including sub-interposers, a molding layer at least partially surrounding the sub-interposers, and a redistribution layer covering top surfaces of the sub-interposers and a top surface of the molding layer; and a first semiconductor chip and a second semiconductor chip on the interposer substrate. The sub-interposers may be horizontally spaced apart from each other with the molding layer in spaces between the sub-interposers. Each of the sub-interposers may include through electrodes penetrating the sub-interposer and connecting to the redistribution layer. The package substrate may be electrically connected to the first semiconductor chip and the second semiconductor chip through the redistribution layer.

BRIEF DESCRIPTION OF THE DRAWINGS

FIG. 2 illustrates a plan view showing a semiconductor package according to some embodiments of the present inventive concepts.

FIG. 4 illustrates a plan view showing a semiconductor package according to some embodiments of the present inventive concepts.

FIG. 6 illustrates a plan view showing a semiconductor package according to some embodiments of the present inventive concepts.

FIG. 7 illustrates a cross-sectional view showing a semiconductor package according to some embodiments of the present inventive concepts.

FIGS. 8 to 13 illustrate cross-sectional views showing a method of fabricating a semiconductor package according to some embodiments of the present inventive concepts.

DETAILED DESCRIPTION

The following will now describe a semiconductor package according to the present inventive concepts with reference to the accompanying drawings.

Figure 1:
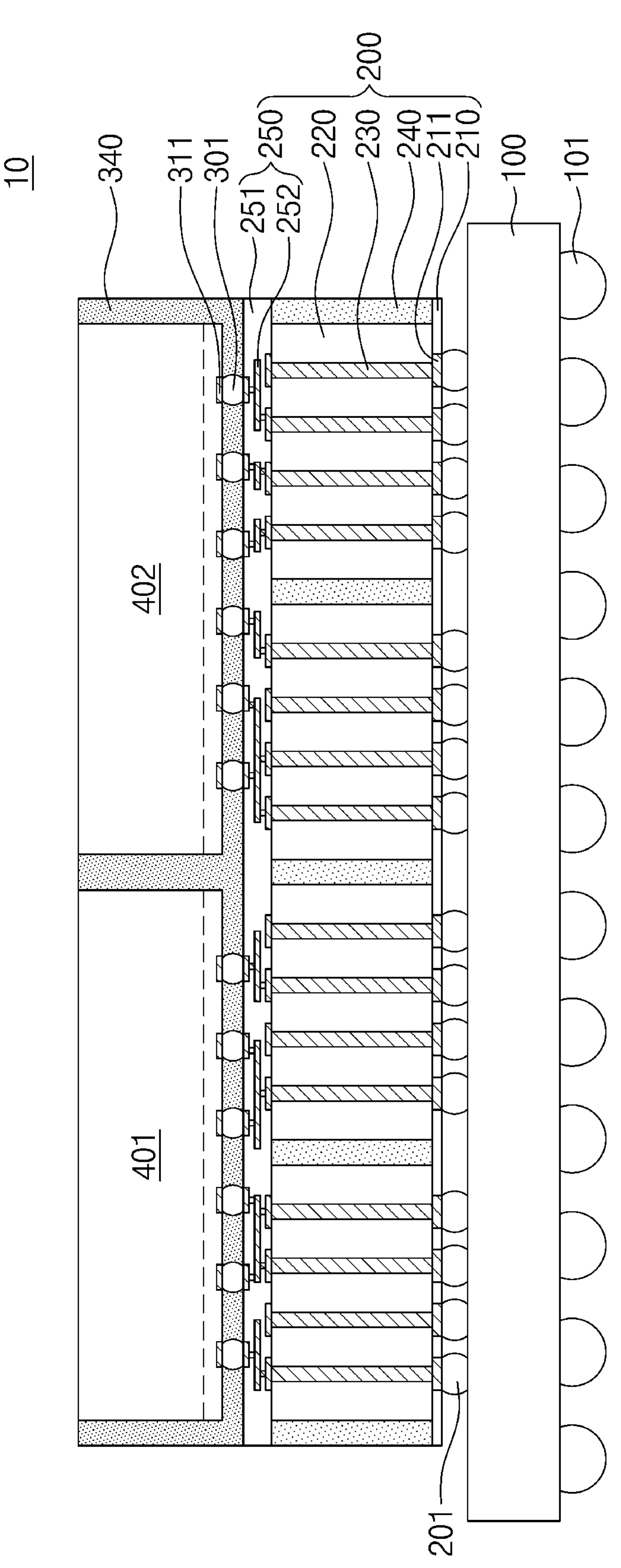
FIG. 1 illustrates a cross-sectional view showing a semiconductor package according to some embodiments of the present inventive concepts.
Figure 2:
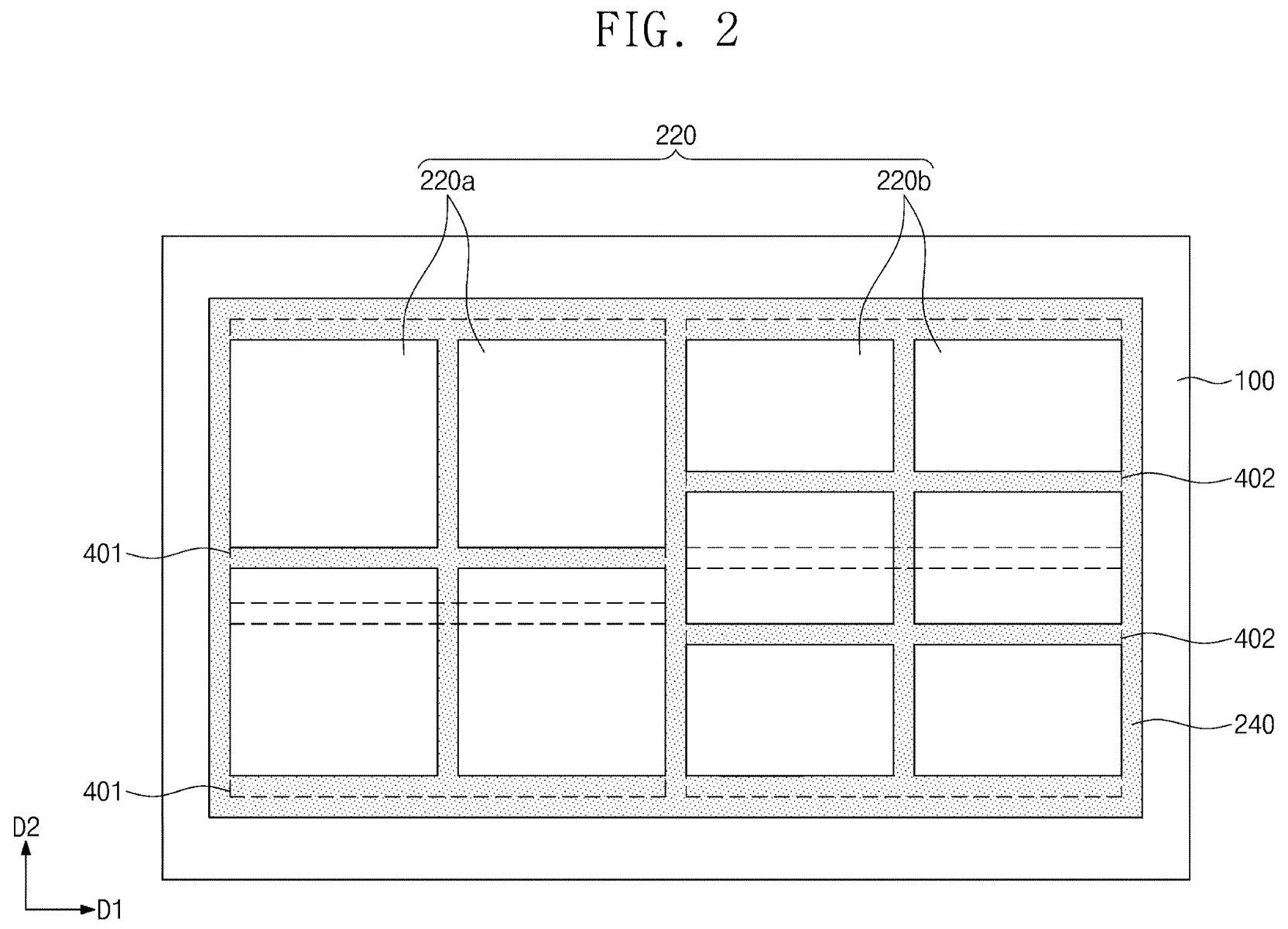

FIG. 1 illustrates a cross-sectional view showing a semiconductor package according to some example embodiments of the present inventive concepts. FIG. 2 illustrates a plan view showing a semiconductor device according to example embodiments of the present inventive concepts.

Referring to FIGS. 1 and 2, a semiconductor package 10 may include a package substrate 100, an interposer substrate 200, a first semiconductor chip 401, a second semiconductor chip 402, an upper molding layer 340, and a lower molding layer 240.

A package substrate 100 may be provided. The package substrate 100 may include a printed circuit board (PCB). The package substrate 100 may be a structure in which at least one dielectric layer and at least one wiring layer are alternately stacked. The package substrate 100 may have package substrate pads disposed on top and bottom surfaces thereof.

The package substrate 100 may have external connection terminals 101 disposed on the bottom surface thereof. For example, the external connection terminals 101 may be disposed on the package substrate pads provided on the bottom surface of the package substrate 100. The external connection terminals 101 may be laterally spaced apart from each other. The external connection terminals 101 may include solder balls or solder bumps. Based on type of the external connection terminals 101, the semiconductor package 10 may have a ball grid array (BGA) type, a fine ball-grid array (FBGA) type, or a land grid array (LGA) type.

An interposer substrate 200 may be provided on the package substrate 100. The interposer substrate 200 may include a first dielectric layer 210, sub-interposers 220, a lower molding layer 240, and a redistribution layer 250.

The sub-interposers 220 may be disposed on the first dielectric layer 210. The sub-interposers 220 may be disposed horizontally spaced apart from each other. Each of the sub-interposers 220 may have a rectangular or square planar shape. When viewed in plan, the sub-interposers 220 may have their areas different from each other. The number, shape, and area of the sub-interposers 220 are not limited to those depicted in FIG. 2 and may be variously changed if necessary. The sub-interposers 220 may include silicon (Si).

The sub-interposers 220 may include first sub-interposers **220*a* and second sub-interposers 220*b* spaced apart from the first sub-interposers 220*a*. The first sub-interposers 220*a* may be spaced apart in a first direction D1 from the second sub-interposers 220*b*. The first direction D1 may be parallel to a top surface of the interposer substrate 200. The first sub-interposers 220*a* may be spaced apart from each other in a second direction D2 perpendicular to the first direction D1, and this may also be true of the second sub-interposers 220*b*. An arrangement of the sub-interposers 220 is not limited to that depicted in FIG. 2, and may be variously changed if necessary. For example, the sub-interposers 220 having the same area may be uniformly arranged on the first dielectric layer 210**.

Each of the sub-interposers 220 may include through electrodes 230 that penetrate therethrough. The through electrodes 230 may penetrate the sub-interposer 220 in a direction perpendicular to top surfaces of the sub-interposers 220. The thorough electrodes 230 may have their top surfaces exposed on the top surfaces of the sub-interposers 220. The through electrodes 230 may have their bottom surfaces exposed on bottom surfaces of the sub-interposers 220. A plurality of through electrodes 230 may be provided in each of the sub-interposers 220. The through electrodes 230 may include a conductive material. The through electrodes 230 may include copper (Cu).

The lower molding layer 240 may be provided on the first dielectric layer 210. The lower molding layer 240 may surround the sub-interposers 220. For example, the lower molding layer 240 may cover or surround lateral or side surfaces of the sub-interposers 220. On the first dielectric layer 210, the lower molding layer 240 may fill a space between the sub-interposers 220. The sub-interposers 220 may be spaced apart from each other across the lower molding layer 240. The top surfaces of the sub-interposers 220 may be exposed on a top surface of the lower molding layer 240, and the bottom surfaces of the sub-interposers 220 may be exposed on a bottom surface of the lower molding layer 240. The top surface of the lower molding layer 240 may be coplanar with the top surfaces of the sub-interposers 220. The bottom surface of the lower molding layer 240 may be coplanar with the bottom surfaces of the sub-interposers 220. The lower molding layer 240 may include a dielectric material, such as an epoxy molding compound (EMC).

The first dielectric layer 210 may be disposed on the bottom surfaces of the sub-interposers 220 and the bottom surface of the lower molding layer 240. The first dielectric layer 210 may be provided to cover the bottom surfaces of the sub-interposers 220 and the bottom surface of the lower molding layer 240. The first dielectric layer 210 may include substrate pads 211. The substrate pads 211 may be exposed on top and bottom surfaces of the first dielectric layer 210. The substrate pads 211 exposed on the top surface of the first dielectric layer 210 may be coupled to the through electrodes 230. In this description, the phrase "two components are electrically connected/coupled to each other" may include the meaning that the two components are directly connected/coupled to each other or indirectly connected/coupled through other component(s) to each other. The first dielectric layer 210 may include a dielectric material. The first dielectric layer 210 may include a dielectric polymer or a photosensitive polymer.

The redistribution layer 250 may be disposed on the top surfaces of the sub-interposers 220 and the top surface of the lower molding layer 240. The redistribution layer 250 may cover the top surfaces of the sub-interposers 220 and the top surface of the lower molding layer 240. The redistribution layer 250 may have a bottom surface in contact with the top surfaces of the sub-interposers 220 and the top surface of the lower molding layer 240. The redistribution layer 250 may have a lateral or side surface vertically aligned or coplanar with a lateral or side surface of the lower molding layer 240. For example, the redistribution layer 250 may have a width the same as that of the lower molding layer 240.

The redistribution layer 250 may include a second dielectric layer 251 and a wiring pattern 252. The second dielectric layer 251 may have a structure in which dielectric layers are stacked. The wiring pattern 252 may be provided in the second dielectric layer 251. The wiring pattern 252 may be a pattern for redistributing the first semiconductor chip 401 and the second semiconductor chip 402 which will be discussed below. The wiring pattern 252 may have a via part and a line part that are connected into a single unitary body. The line part may be a portion for horizontal connection in the redistribution layer 250. The via part may be a portion for vertical connection of the line part. A lowermost one of a plurality of wiring patterns 252 may have a bottom surface exposed on a bottom surface of the second dielectric layer 251. A plurality of lowermost wiring patterns 252 may be coupled to the through electrodes 230. Therefore, the redistribution layer 250 may be electrically connected through the through electrodes 230 to the interposer substrate 200. An uppermost one of the wiring patterns 252 may have a top surface exposed on a top surface of the second dielectric layer 251. A plurality of uppermost wiring patterns 252 may be coupled to second connection bumps 301 which will be discussed below. The wiring pattern 252 may include a conductive material. For example, the wiring pattern 252 may include copper (Cu).

First connection bumps 201 may be provided between the interposer substrate 200 and the package substrate 100. The first connection bumps 201 may be coupled to the top surface of the package substrate 100. The first connection bumps 201 may be coupled to the substrate pads 211 exposed on the bottom surface of the first dielectric layer 210. The first connection bumps 201 may be connected through the substrate pads 211 to the through electrodes 230. Therefore, the interposer substrate 200 and the package substrate 100 may be electrically connected to each other through the first connection bumps 201. The first connection bumps 201 may include solder balls or solder bumps.

Although not shown, the semiconductor package 10 may include an under-fill layer provided between the package substrate 100 and the interposer substrate 200. The under-fill layer may surround lateral surfaces of the first connection bumps 201, while filling a space between the package substrate 100 and the interposer substrate 200. The under-fill layer may include a dielectric polymer material, such as epoxy resin.

The first semiconductor chip 401 and the second semiconductor chip 402 may be disposed on the interposer substrate 200. The first semiconductor chip 401 and the second semiconductor chip 402 may be disposed horizontally spaced apart from each other on the interposer substrate 200. For example, a single first semiconductor chip 401 and a single second semiconductor chip 402 may be disposed spaced apart from each other on the interposer substrate 200. For another example, each of the first and second semiconductors 401 and 402 may be provided in plural on the interposer substrate 200. The first semiconductor chips 401 may be horizontally spaced apart from each other on the redistribution layer 250 of the interposer substrate 200. An interval or spacing between the first semiconductor chips 401 may range from about 1 μm to about 200 μm. The second semiconductor chips 402 may be horizontally spaced apart from each other on the redistribution layer 250 of the interposer substrate 200. An interval or spacing between the second semiconductor chips 402 may range from about 1 μm to about 200 μm. An interval or spacing between the first and second semiconductor chips 401 and 402 may range from about 1 nm to about 200 μm. FIG. 2 depicts two first semiconductor chips 401 and two second semiconductor chips 402, but the number of the first semiconductor chips 401 and that of the second semiconductor chips 402 may be changed if necessary.

The first semiconductor chips 401 and the second semiconductor chips 402 may vertically overlap or align with the sub-interposers 220. The first semiconductor chips 401 may vertically overlap the first sub-interposers 220*a*. Each of the first semiconductor chips 401 may vertically overlap two or more first sub-interposers 220*a*. Each of the first sub-interposers 220*a* may have an area less than that of each of the first semiconductor chips 401. A sum of areas of the first sub-interposers 220*a* that overlap the first semiconductor chips 401 may be less than that of areas of the first semiconductor chips 401. For example, a sum of areas of top surfaces of the first sub-interposers 220*a* that overlap the first semiconductor chips 401 may be less than a sum of areas of bottom surfaces of the first semiconductor chips 401.

The second semiconductor chips 402 may vertically overlap the second sub-interposers 220*b*. Each of the second semiconductor chips 402 may vertically overlap two or more second sub-interposers 220*b*. Each of the second sub-interposers 220*b* may have an area less than that of each of the second semiconductor chips 402. A sum of areas of the second sub-interposers 220*b* that overlap the second semiconductor chips 402 may be less than that of areas of the second semiconductor chips 402. For example, a sum of areas of top surfaces of the second sub-interposers 220*b* that overlap the second semiconductor chips 402 may be less than a sum of areas of bottom surfaces of the second semiconductor chips 402. A sum of areas of the first semiconductor chips 401 and the second semiconductor chips 402 may be greater than that of areas of the sub-interposers 220. For example, a sum of areas of bottom surfaces of the first semiconductor chips 401 and the second semiconductor chips 402 may be greater than a sum of areas of upper surfaces of the sub-interposers 220.

The first semiconductor chips 401 and the second semiconductor chips 402 may vertically overlap a portion of the lower molding layer 240. An arrangement of the sub-interposers 220 is not limited to that shown, and may be changed in accordance with an arrangement of the first semiconductor chips 401 and the second semiconductor chips 402.

The first semiconductor chips 401 and the second semiconductor chips 402 may be flip-chip mounted on the interposer substrate 200. Second connection bumps 301 may be provided between the first semiconductor chips 401 and the interposer substrate 200 and between the second semiconductor chips 402 and the interposer substrate 200. The second connection bumps 301 may be disposed to correspond to chip pads 311 provided on bottom surfaces of the first semiconductor chips 401 and bottom surfaces of the second semiconductor chips 402. The second connection bumps 301 may be coupled to the wiring patterns 252 of the redistribution layer 250, and the second connection bumps 301 may be connected through the redistribution layer 250 to the through electrodes 230 of the interposer substrate 200. Therefore, the first semiconductor chips 401 and the second semiconductor chips 402 may be electrically connected to the package substrate 100 through the second connection bumps 301 and the interposer substrate 200. The first semiconductor chips 401 may include a memory chip, such as dynamic random access memory (DRAM), static random access memory (SRAM), magnetic random access memory (MRAM), or Flash memory. The second semiconductor chips 402 may include a logic chip.

The upper molding layer 340 may be disposed on the interposer substrate 200. The upper molding layer 340 may be in contact with a top surface of the redistribution layer 250. On the redistribution layer 250, the upper molding layer 340 may surround at least portions of the first semiconductor chips 401 and the second semiconductor chips 402. The upper molding layer 340 may fill a space between the redistribution layer 250 and the bottom surfaces of the first semiconductor chips 401 and a space between the redistribution layer 250 and the bottom surfaces of the second semiconductor chips 402, and may cover or surround lateral or side surfaces of the second connection bumps 301. The upper molding layer 340 may have a top surface coplanar with those of the first semiconductor chips 401 and those of the second semiconductor chips 402. The upper molding layer 340 may have a lateral or side surface vertically aligned or coplanar with a lateral or side surface of the interposer substrate 200.

Although not shown, the semiconductor package 10 may further include a heat emission member disposed on the first semiconductor chips 401 and the second semiconductor chips 402. The heat emission member may be in contact with the top surfaces of the first semiconductor chips 401 and the top surfaces of the second semiconductor chips 402. The heat emission member may include a heat slug or a heat sink. The heat emission member may include a material, such as metal, having a high thermal conductivity.

Figure 3:
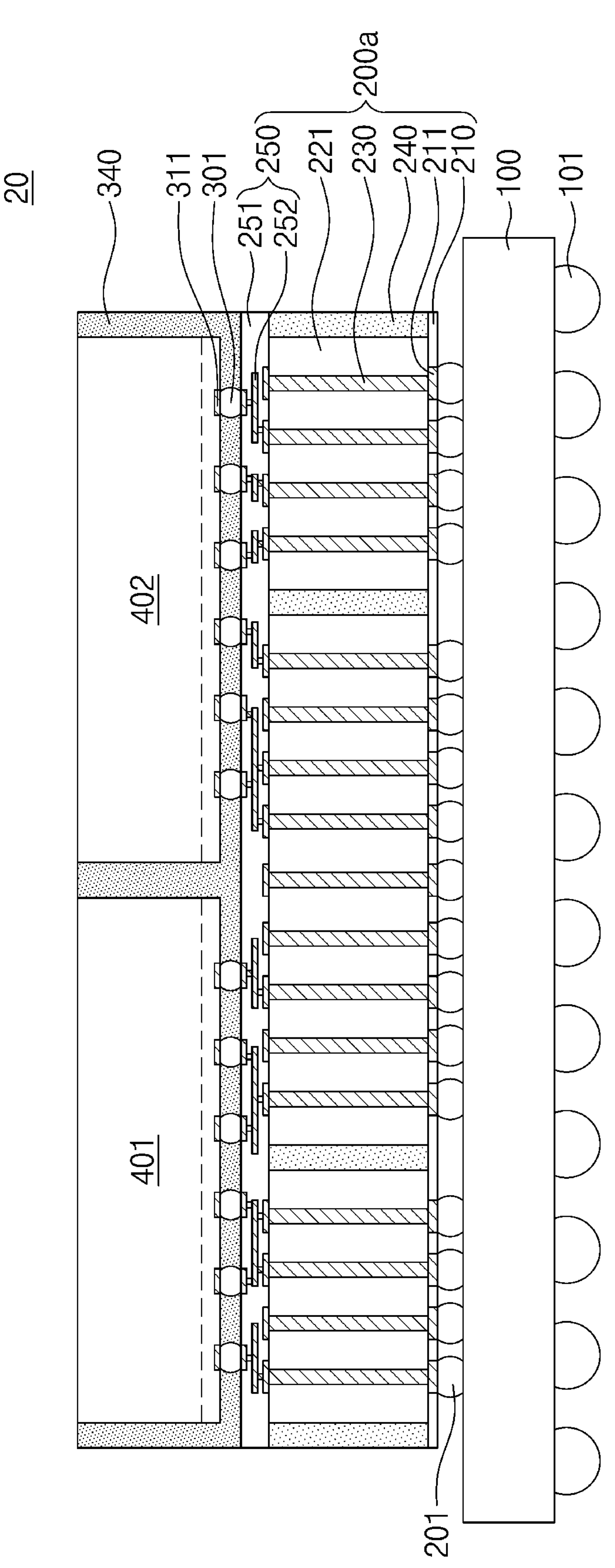
FIG. 3 illustrates a cross-sectional view showing a semiconductor package according to some embodiments of the present inventive concepts.
Figure 4:
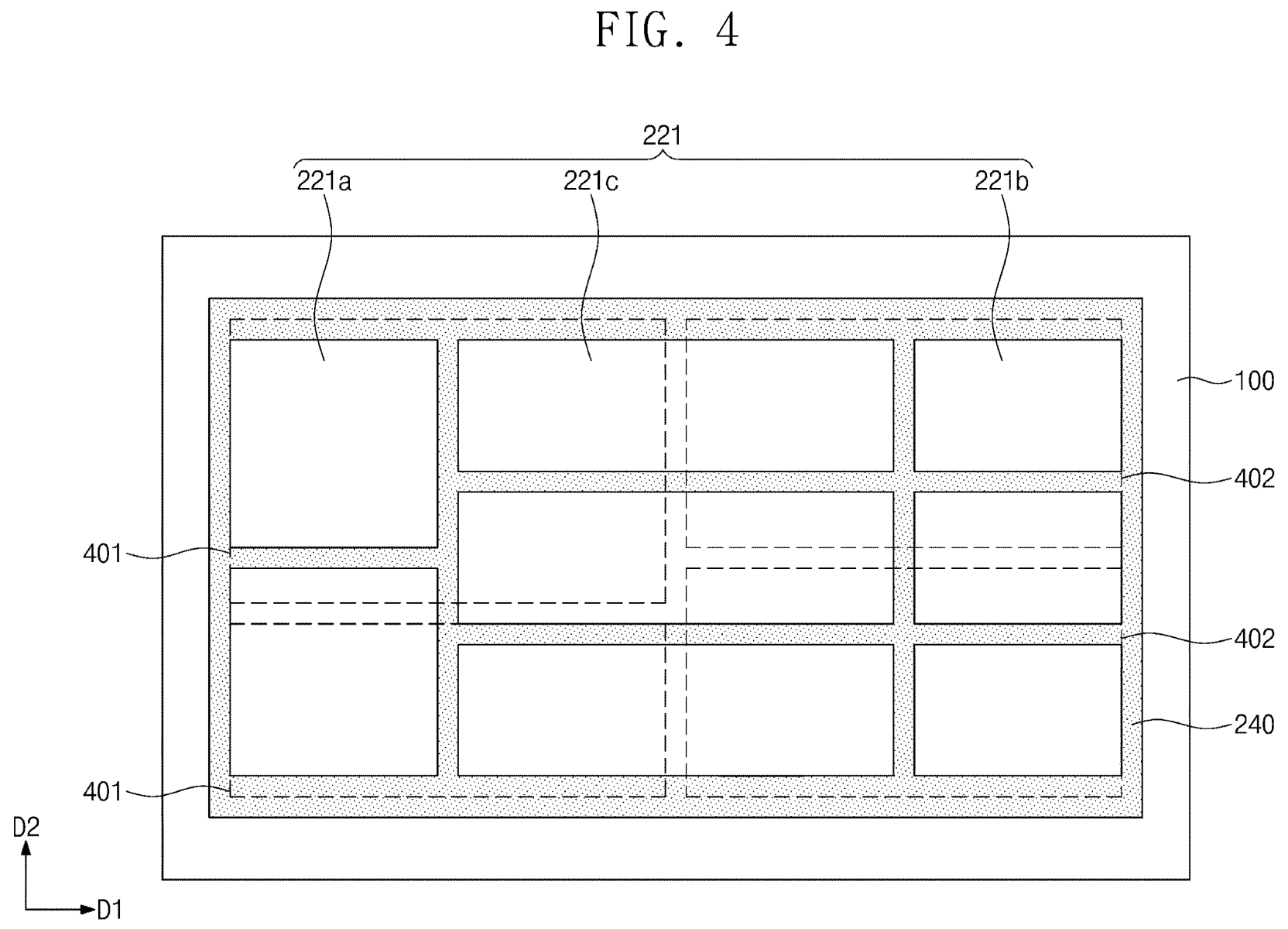

FIG. 3 illustrates a cross-sectional view showing a semiconductor package according to some example embodiments of the present inventive concepts. FIG. 4 illustrates a plan view showing a semiconductor device according to example embodiments of the present inventive concepts. In the interest of brevity, the following will omit an explanation of components repetitive to those discussed above, and for convenience of description, the same components discussed with reference to FIGS. 1 and 2 will be discussed using the same reference numerals.

Referring to FIGS. 3 and 4, a semiconductor package 20 may include a package substrate 100, an interposer substrate 200*a*, first semiconductor chips 401, second semiconductor chips 402, and an upper molding layer 340. The package substrate 100, the first semiconductor chips 401, the second semiconductor chips 402, and the upper molding layer 340 of the semiconductor package 20 may be identical or similar to those discussed with reference to FIGS. 1 and 2.

The interposer substrate 200*a* may include a first dielectric layer 210, a lower molding layer 240, sub-interposers 221, and a redistribution layer 250.

The sub-interposers 221 may be disposed on the first dielectric layer 210. The sub-interposers 221 may include first sub-interposers 221*a*, second sub-interposers 221*b*, and third sub-interposers 221*c* that are spaced apart from each other in a first direction D1. The first sub-interposers 221*a* may be spaced apart from each other in a second direction D2, and this may also be true of the second sub-interposers 221*b* and the third sub-interposers 221*c*. The first sub-interposers 221*a* may vertically overlap or align with the first semiconductor chips 401, and the second sub-interposers 221*b* may vertically overlap or align with the second semiconductor chips 402. The third sub-interposers 221*c* may be provided between the first sub-interposers 221*a* and the second sub-interposers 221*b*. The third sub-interposers 221*c* may vertically overlap or align with at least portions of the first semiconductor chips 401 and at least portions of the second semiconductor chips 402. For example, first portions of the third sub-interposers 221*c* may vertically overlap portions of the first semiconductor chips 401, and second portions of the third sub-interposers 221*c* may vertically overlap portions of the second semiconductor chips 402. When viewed in plan, the third sub-interposers 221*c* may extend from locations below the first semiconductor chips 401 toward locations below the second semiconductor chips 402. The third sub-interposers 221*c* may be electrically connected to the first semiconductor chips 401 and the second semiconductor chips 402.

The first semiconductor chips 401 may vertically overlap at least two sub-interposers 221, and the sub-interposers 221 that vertically overlap the first semiconductor chips 401 may include the first and third sub-interposers 221*a* and 221*c*. A sum of areas of the sub-interposers 221 that vertically overlap the first semiconductor chips 401 may be less than that of areas of the first semiconductor chips 401. For example, a sum of areas of upper surfaces of the sub-interposers 221 that vertically overlap the first semiconductor chips 401 may be less than a sum of areas of bottom surfaces of the first semiconductor chips 401.

The second semiconductor chips 402 may vertically overlap at least two sub-interposers 221, and the sub-interposers 221 that vertically overlap the second semiconductor chips 402 may include the second and third sub-interposers 221*b* and 221*c*. A sum of areas of the sub-interposers 221 that vertically overlap the second semiconductor chips 402 may be less than that of areas of the second semiconductor chips 402. For example, a sum of areas of upper surfaces of the sub-interposers 221 that vertically overlap the second semiconductor chips 402 may be less than a sum of areas of bottom surfaces of the second semiconductor chips 402.

A sum of areas of the first semiconductor chips 401 and the second semiconductor chips 402 may be greater than that of areas of the sub-interposers 221. For example, a sum of areas of bottom surfaces of the first semiconductor chips 401 and the second semiconductor chips 402 may be greater than a sum of areas of upper surfaces of the sub-interposers 221. An arrangement of the sub-interposers 221 may depend on that of the first semiconductor chips 401 and the second semiconductor chips 402.

Figure 5:
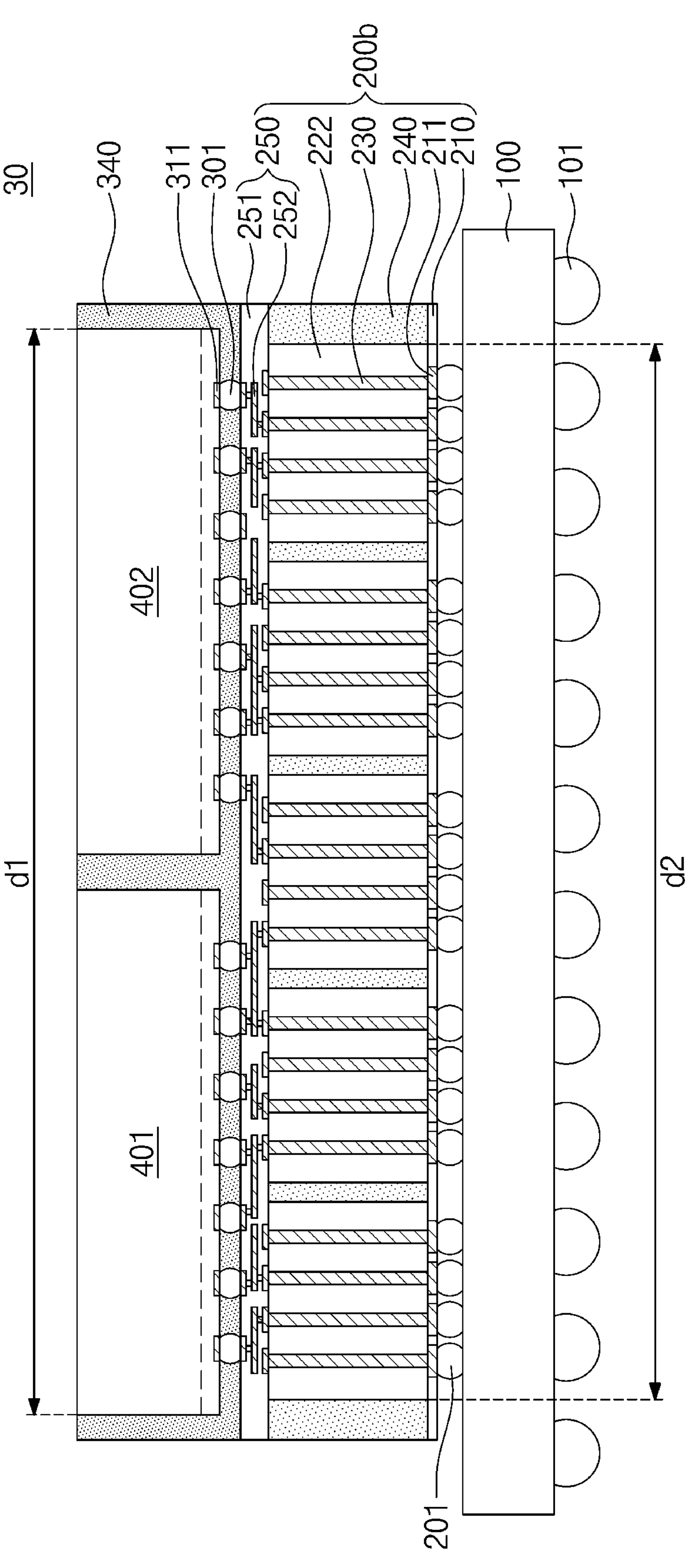
FIG. 5 illustrates a cross-sectional view showing a semiconductor package according to some embodiments of the present inventive concepts.
Figure 6:
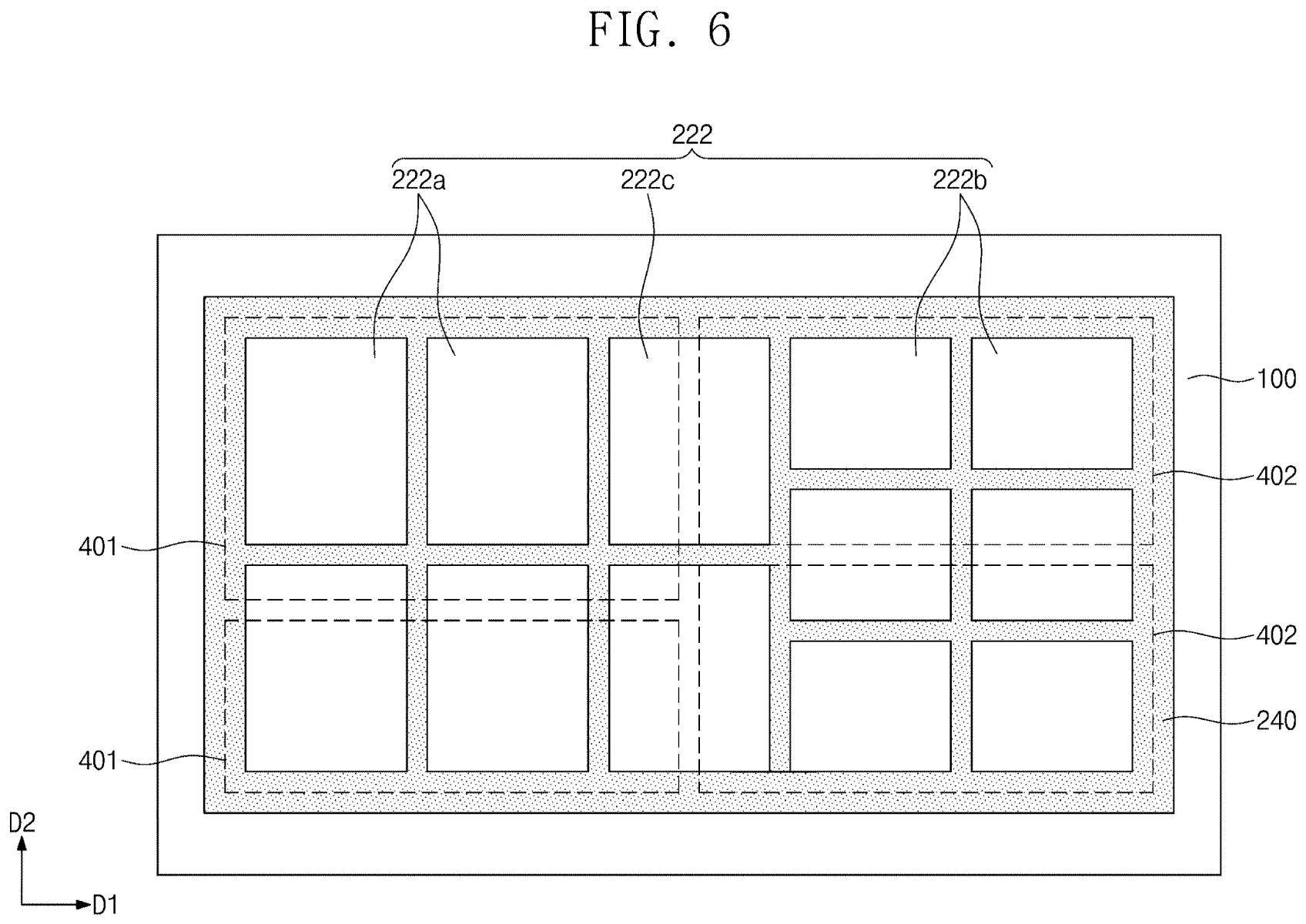

FIG. 5 illustrates a cross-sectional view showing a semiconductor package according to some example embodiments of the present inventive concepts. FIG. 6 illustrates a plan view showing a semiconductor device according to example embodiments of the present inventive concepts. In the interest of brevity, the following will omit an explanation of components repetitive to those discussed above, and for convenience of description, the same components discussed with reference to FIGS. 1 and 2 will be discussed using the same reference numerals.

Referring to FIGS. 5 and 6, a semiconductor package 30 may include a package substrate 100, an interposer substrate 200*b*, first semiconductor chips 401, second semiconductor chips 402, and an upper molding layer 340. The package substrate 100, the first semiconductor chips 401, the second semiconductor chips 402, and the upper molding layer 340 of the semiconductor package 30 may be identical or similar to those discussed with reference to FIGS. 1 and 2.

The interposer substrate 200*b* may include a first dielectric layer 210, a lower molding layer 240, sub-interposers 222, and a redistribution layer 250.

An interval or distance d1 between lateral or side surfaces of the second semiconductor chips 402 and lateral or side surfaces of the first semiconductor chips 401 adjacent to a lateral surface of the upper molding layer 340 may be greater than an interval or distance d2 between lateral or side surfaces of the sub-interposers 222 adjacent to a lateral surface of the lower molding layer 240.

The sub-interposers 222 may be disposed on the first dielectric layer 210. The sub-interposers 222 may include first sub-interposers 222*a*, second sub-interposers 222*b*, and third sub-interposers 222*c* that are spaced apart from each other in a first direction D1. The first sub-interposers 222*a* may constitute two columns that are spaced apart from each other in a first direction D1, and likewise the second sub-interposers 222*b* may also constitute two columns that are spaced apart from each other in the first direction D1. The first sub-interposers 222*a* may be spaced apart from each other in a second direction D2, and this may also be true of the second sub-interposers 222*b* and the third sub-interposers 222*c*. The first sub-interposers 222*a* may vertically overlap or align with the first semiconductor chips 401, and the second sub-interposers 222*b* may vertically overlap or align with the second semiconductor chips 402. The third sub-interposers 222*c* may be disposed between the first sub-interposers 222*a* and the second sub-interposers 222*b*. The third sub-interposers 222*c* may vertically overlap or align with at least portions of the first semiconductor chips 401 and at least portions of the second semiconductor chips 402. For example, first portions of the third sub-interposers 222*c* may vertically overlap portions of the first semiconductor chips 401, and second portions of the third sub-interposers 222*c* may vertically overlap portions of the second semiconductor chips 402. When viewed in plan, the third sub-interposers 222*c* may extend from locations below the first semiconductor chips 401 toward locations below the second semiconductor chips 402. The third sub-interposers 222*c* may be electrically connected to the first semiconductor chips 401 and the second semiconductor chips 402.

The first semiconductor chips 401 may vertically overlap at least two sub-interposers 222, and the sub-interposers 222 that vertically overlap the first semiconductor chips 401 may include the first and third sub-interposers 222*a* and 222*c*. A sum of areas of the sub-interposers 222 that vertically overlap the first semiconductor chips 401 may be less than that of areas of the first semiconductor chips 401. For example, a sum of areas of upper surfaces of the sub-interposers 222 that vertically overlap the first semiconductor chips 401 may be less than a sum of areas of bottom surfaces the first semiconductor chips 401.

The second semiconductor chips 402 may vertically overlap at least two sub-interposers 222, and the sub-interposers 222 that vertically overlap the second semiconductor chips 402 may include the second and third sub-interposers 222*b* and 222*c*. A sum of areas of the sub-interposers 222 that vertically overlap the second semiconductor chips 402 may be less than that of areas of the second semiconductor chips 402. For example, a sum of areas of upper surfaces of the sub-interposers 222 that vertically overlap the second semiconductor chips 402 may be less than a sum of areas of bottom surfaces of the second semiconductor chips 402.

A sum of areas of the first semiconductor chips 401 and the second semiconductor chips 402 may be greater than that of areas of the sub-interposers 222. For example, a sum of areas of bottom surfaces of the first semiconductor chips 401 and the second semiconductor chips 402 may be greater than a sum of areas of upper surfaces of the sub-interposers 222. An arrangement of the sub-interposers 222 may depend on that of the first semiconductor chips 401 and the second semiconductor chips 402.

Figure 7:
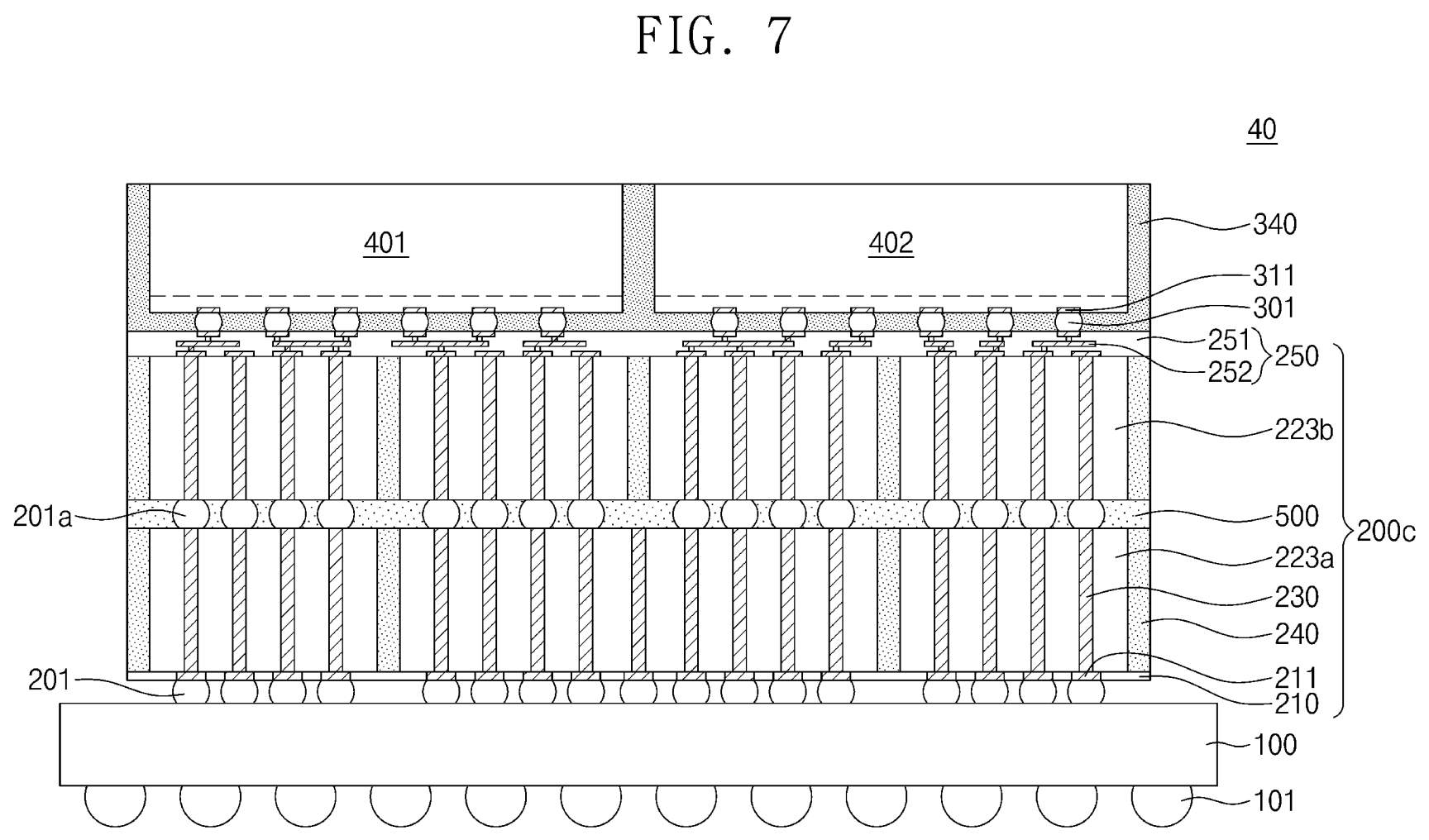

FIG. 7 illustrates a cross-sectional view showing a semiconductor package according to some example embodiments of the present inventive concepts. In the interest of brevity, the following will omit an explanation of components repetitive to those discussed above, and for convenience of description, the same components discussed with reference to FIGS. 1 and 2 will be discussed using the same reference numerals.

Referring to FIG. 7, a semiconductor package 40 may include a package substrate 100, an interposer substrate 200*c*, a first semiconductor chip 401, a second semiconductor chip 402, and an upper molding layer 340. The package substrate 100, the first semiconductor chip 401, the second semiconductor chip 402, and the upper molding layer 340 of the semiconductor package 40 may be identical or similar to those discussed with reference to FIGS. 1 and 2.

The interposer substrate 200*c* may include a first dielectric layer 210, a lower molding layer 240, lower sub-interposers 223*a*, upper sub-interposers 223*b*, and a redistribution layer 250. Each of the lower and upper sub-interposers 223*a* and 223*b* may include through electrodes 230 that penetrate therethrough.

The upper sub-interposers 223*b* and the lower sub-interposers 223*a* may be disposed on the first dielectric layer 210 of the interposer substrate 200*c*. The upper sub-interposers 223*b* and the lower sub-interposers 223*a* may be stacked in the interposer substrate 200*c*. The upper sub-interposers 223*b* may be disposed on the lower sub-interposers 223*a*. The upper sub-interposers 223*b* may vertically overlap or align with the lower sub-interposers 223*a*. At least one of the lower sub-interposers 223*a* may vertically overlap the upper sub-interposers 223*b*. Alternatively, the upper sub-interposers 223*b* may include one that vertically overlaps at least two lower sub-interposers 223*a*.

As shown in FIG. 7, the semiconductor package 40 may include the interposer substrate 200*c* that has two layers made of the upper sub-interposers 223*b* and the lower sub-interposers 223*a*. The present inventive concepts, however, are not limited thereto, and the interposer substrate 200*c* may include an interposer stack in which three or more layers are stacked.

The interposer substrate 200*c* may have therein third connection bumps 201*a* provided between the upper sub-interposers 223*b* and the lower sub-interposers 223*a*. The third connection bumps 201*a* may be coupled to the through electrodes 230 in the upper and lower sub-interposers 223*b* and 223*a*. The upper sub-interposers 223*b* may be electrically connected through the third connection bumps 201*a* to the lower sub-interposers 223*a*. The third connection bumps 201*a* may include solder balls or solder bumps. Differently from that shown, the upper sub-interposers 223*b* and the lower sub-interposers 223*a* may be connected through a copper-to-copper intermetallic hybrid bonding.

An under-fill layer 500 may cover or surround lateral or side surfaces of the third connection bumps 201*a*, while filling a space between the upper sub-interposers 223*b* and the lower sub-interposers 223*a*. The under-fill layer 500 may be in contact with bottom surfaces of the upper sub-interposers 223*b* and top surfaces of the lower sub-interposers 223*a*. The under-fill layer 500 may include a dielectric polymer material, such as epoxy resin.

The through electrodes 230 of the upper sub-interposers 223*b* may be connected to the redistribution layer 250. The through electrodes 230 of the lower sub-interposers 223*a* may be connected to the first connection bumps 201. Therefore, the first and second semiconductor chips 401 and 402 may be electrically connected to the package substrate 100 through the upper sub-interposers 223*b* and the lower sub-interposers 223*a*.

A lower molding layer 240 may include a first lower molding layer that surrounds the lower sub-interposers 223*a* and a second lower molding layer that surrounds the upper sub-interposers 223*b*. The first lower molding layer may fill a space between the lower sub-interposers 223*a*. The first lower molding layer may separate the lower sub-interposers 223*a* from each other. The second lower molding layer may fill a space between the upper sub-interposers 223*b*. The second lower molding layer may separate the upper sub-interposers 223*b* from each other. Differently from that shown, the first lower molding layer and the second lower molding layer may be connected to each other. The lower molding layer 240 may include a dielectric material, such as an epoxy molding compound (EMC).

FIGS. 8 to 13 illustrate cross-sectional views showing a method of fabricating a semiconductor package according to some embodiments of the present inventive concepts.

Figures 8, 9:
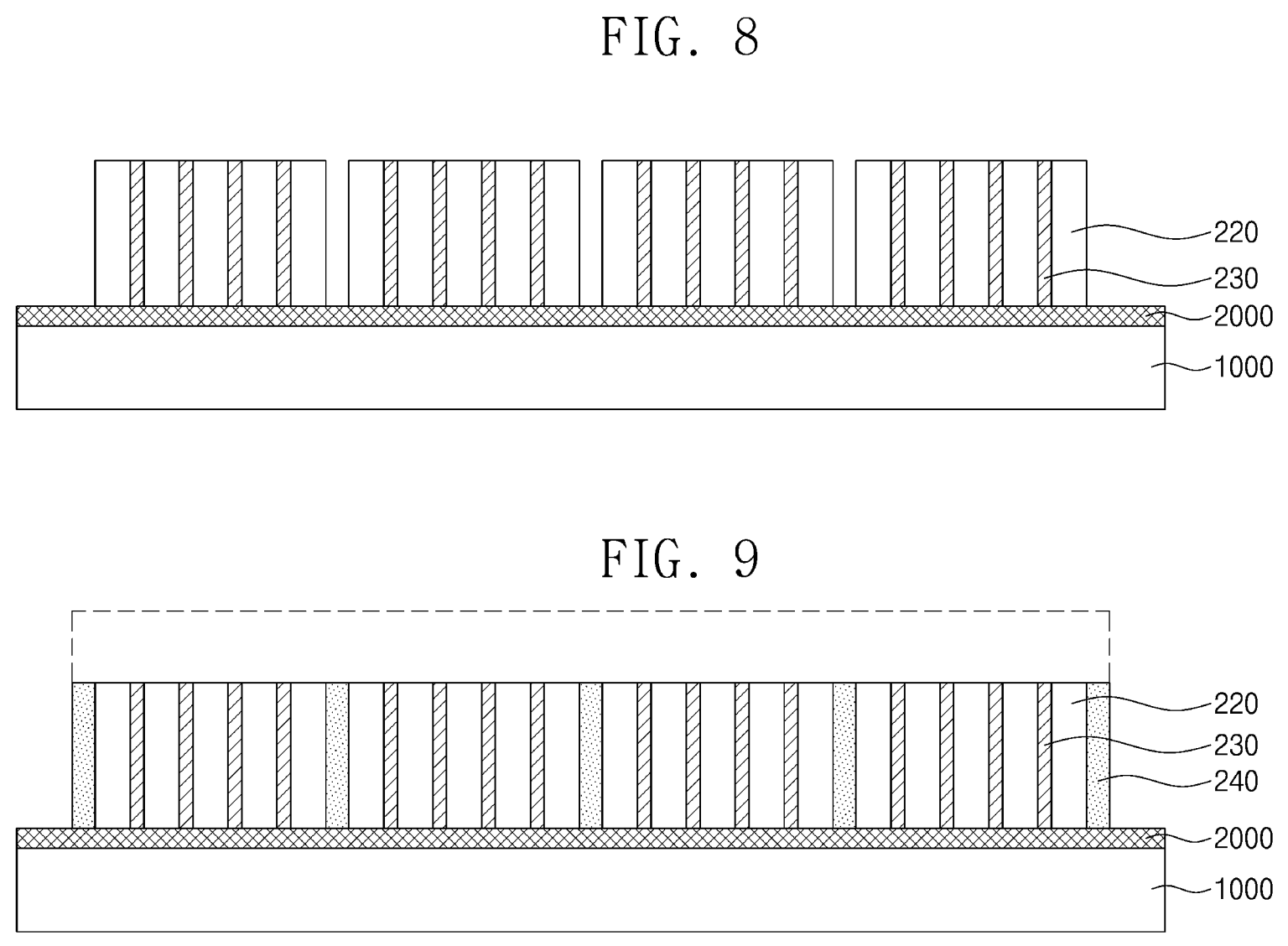

Referring to FIG. 8, a carrier substrate 1000 may be provided. The carrier substrate 1000 may be a dielectric substrate including glass or polymer. An adhesion member 2000 may be provided on a top surface of the carrier substrate 1000. The adhesion member 2000 may include an adhesive material. For example, the adhesion member 2000 may include a glue tape.

The carrier substrate 1000 may be provided with sub-interposers 220 thereon. The sub-interposers 220 may be attached through the adhesion member 2000 to the carrier substrate 1000. The sub-interposers 220 may be attached spaced apart from each other on the carrier substrate 1000. The sub-interposers 220 may include through electrodes 230 that penetrate therethrough. The sub-interposers 220 may include silicon (Si).

Referring to FIG. 9, a lower molding layer 240 may be formed on the carrier substrate 1000. For example, a dielectric material may be coated on the carrier substrate 1000 to form the lower molding layer 240. The sub-interposers 220 may be surrounded by the lower molding layer 240. The lower molding layer 240 may be formed to surround each of the sub-interposers 220. The lower molding layer 240 may fill a space between the sub-interposers 220 that are spaced apart from each other. The dielectric material may include an adhesive material or an insulating material such as an epoxy molding compound (EMC).

A grinding process may be performed on the lower molding layer 240. The grinding process may partially remove an upper portion of the lower molding layer 240 formed on top surfaces of the sub-interposers 220. If necessary, upper portions of the sub-interposers 220 may be partially removed together with the lower molding layer 240. The grinding process may expose the top surfaces of the sub-interposers 220. After the grinding process, the top surfaces of the sub-interposers 220 may be coplanar with that of the lower molding layer 240.

Figure 10:
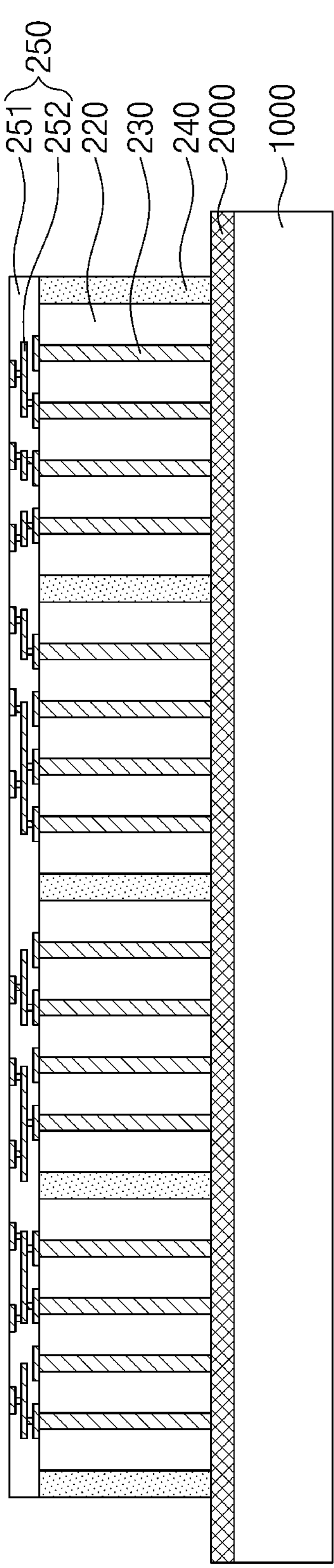

Referring to FIG. 10, a redistribution layer 250 may be formed on the top surfaces of the sub-interposers 220 and the top surface of the lower molding layer 240. The redistribution layer 250 may be formed to cover the top surfaces of the sub-interposers 220 and the top surface of the lower molding layer 240. A bottom surface of the redistribution layer 250 may be in contact with the top surfaces of the sub-interposers 220 and the top surface of the lower molding layer 240.

The formation of the redistribution layer 250 may include forming a second dielectric layer 251 and forming a wiring pattern 252. Although not shown, dielectric layers may be stacked to form the second dielectric layer 251. The wiring pattern 252 may have a via part and a line part that are connected into a single unitary body. The line part may be a portion for horizontal connection in the redistribution layer 250. The via part may be a portion for vertical connection of the line part. Lowermost ones of a plurality of wiring patterns 252 may be formed to connect to the through electrodes 230. Uppermost ones of a plurality of wiring patterns 252 may have their top surfaces exposed on a top surface of the redistribution layer 250. The wiring pattern 252 may include a conductive material. For example, the wiring pattern 252 may include copper (Cu).

Figure 11:
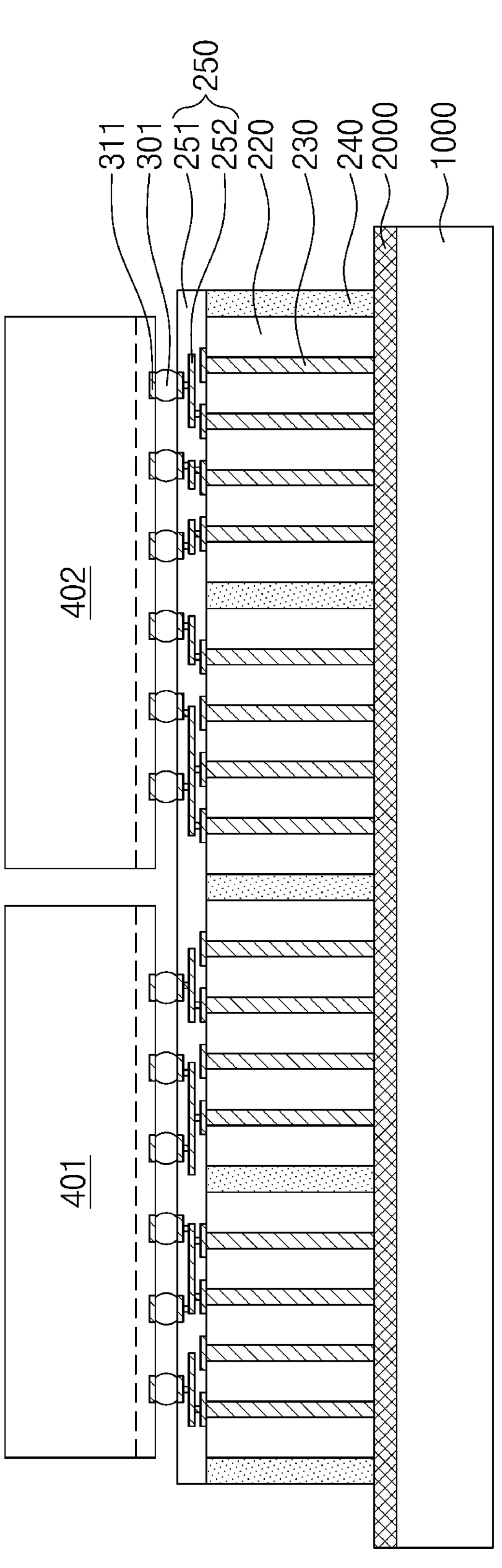

Referring to FIG. 11, second connection bumps 301 may be disposed on the redistribution layer 250. The second connection bumps 301 may be coupled to the wiring patterns 252 of the redistribution layer 250.

A first semiconductor chip 401 and a second semiconductor chip 402 may be flip-chip mounted on the redistribution layer 250. The second connection bumps 301 may be coupled to chip pads 311 provided on a bottom surface of the first semiconductor chip 401 and a bottom surface of the second semiconductor chip 402. The first semiconductor chip 401 and the second semiconductor chip 402 may be disposed horizontally spaced apart from each other on the redistribution layer 250. The first semiconductor chip 401 and the second semiconductor chip 402 may be disposed spaced apart from each other at a distance ranging from about 1 μm to about 200 μm. The first semiconductor chips 401 may include a memory chip, such as dynamic random access memory (DRAM), static random access memory (SRAM), magnetic random access memory (MRAM), or Flash memory. The second semiconductor chip 402 may include a logic chip.

Figure 12:
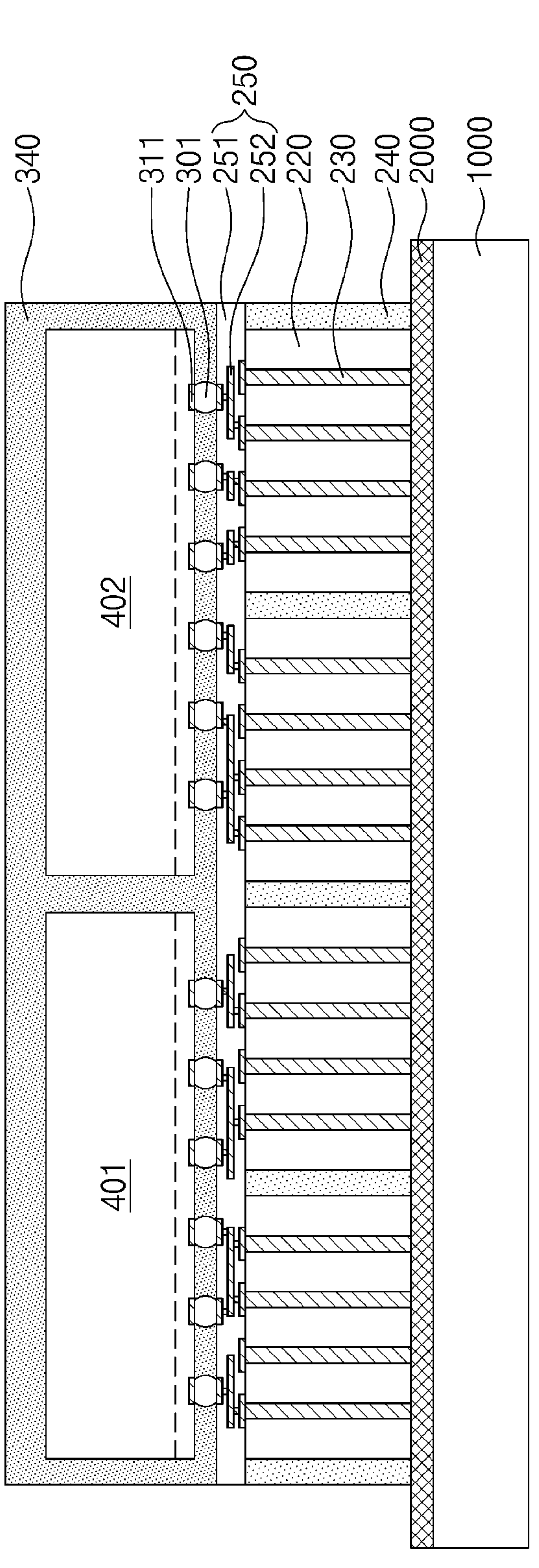

Referring to FIG. 12, an upper molding layer 340 may be formed on the redistribution layer 250 to cover the first semiconductor chip 401 and the second semiconductor chip 402. The first semiconductor chip 401 and the second semiconductor chip 402 may be buried in the upper molding layer 340 on the redistribution layer 250. The upper molding layer 340 may be provided in a space between the top surface of the redistribution layer 250 and the bottom surfaces of the first and second semiconductor chips 401 and 402, and may cover or surround lateral or side surfaces of the second connection bumps 301. The upper molding layer 340 may include an adhesive material or an insulating material such as an epoxy molding compound (EMC).

Figure 13:
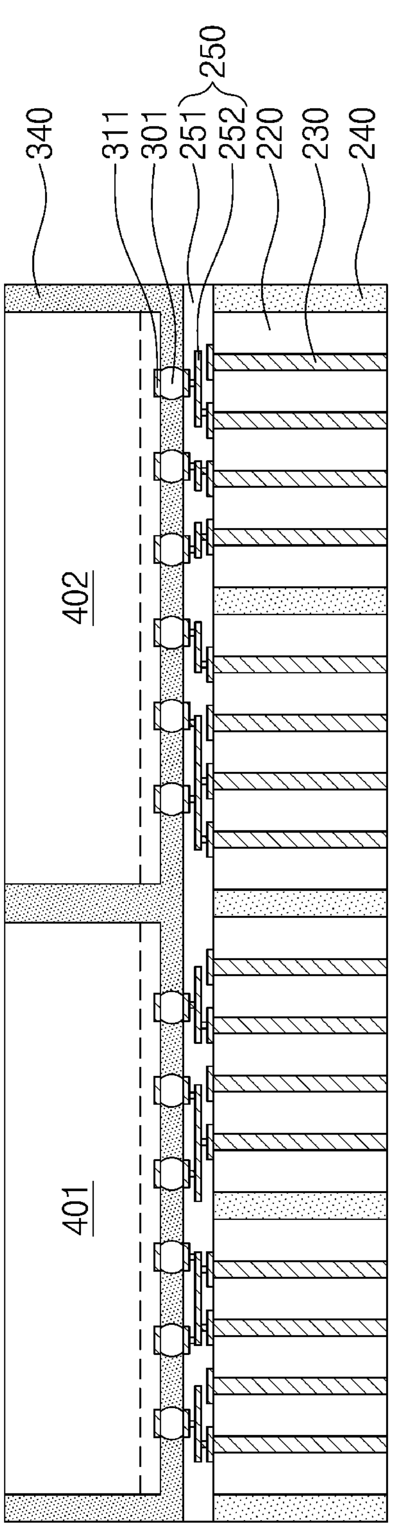

Referring to FIG. 13, a grinding process may be performed on the upper molding layer 340. The grinding process may partially remove an upper portion of the upper molding layer 340. The grinding process may expose a top surface of the first semiconductor chip 401 and a top surface of the second semiconductor chip 402. If necessary, an upper portion of the first semiconductor chip 401 and an upper portion of the second semiconductor chip 402 may be partially removed together with a portion of the upper molding layer 340. After the grinding process, a top surface of the upper molding layer 340 may be coplanar with that of the first semiconductor chip 401 and that of the second semiconductor chip 402. Although not shown, a process may further be performed in which a heat emission member is attached to the top surface of the first semiconductor chip 401 and the top surface of the second semiconductor chip 402.

The carrier substrate 1000 and the adhesion member 2000 may be removed from bottom surfaces of the sub-interposers 220 and a bottom surface of the lower molding layer 240. Referring to, for example, FIG. 1, a first dielectric layer 210 may be formed on the bottom surfaces of the sub-interposers 220. The first dielectric layer 210 may include substrate pads 211 coupled to the through electrodes 230. Therefore, an interposer substrate 200 may be formed which includes the first dielectric layer 210, the sub-interposers 220, the lower molding layer 240, and the redistribution layer 250.

A sawing process may be performed to allow the upper molding layer 340 and the interposer substrate 200 to have their lateral surfaces that are vertically aligned with each other. Although FIGS. 8 to 13 do not depict a plurality of semiconductor packages that are spaced apart from each other and formed at the same time on the carrier substrate 1000 in a method of fabricating a semiconductor package according to some embodiments of the present inventive concepts, the sawing process may be performed such that a plurality of semiconductor packages are divided into an individual semiconductor package.

Referring back to FIG. 1, first connection bumps 201 may be formed on the bottom surfaces of the sub-interposers 220 and the bottom surface of the lower molding layer 240, and the interposer substrate 200 may be mounted on a package substrate 100. A semiconductor package 10 may thus be fabricated. The first connection bumps 201 may include solder balls or solder bumps.

An interposer substrate of a semiconductor package according to some embodiments of the present inventive concepts may be reassembled to include chiplet-shaped sub-interposers. Therefore, an area of each sub-interposer in the interposer substrate may be less than that of a semiconductor chip. In addition, the chiplet-shaped sub-interposers may occupy a low yield (or poor throughput) portion in the interposer substrate, and thus it may be possible to compensate a reduction in yield of the interposer substrate. As a result, the semiconductor package may decrease in manufacturing cost.

Although the present inventive concepts have been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A semiconductor package, comprising:
- a package substrate;
- an interposer substrate on the package substrate;
- first connection bumps between the package substrate and the interposer substrate, the first connection bumps connecting the interposer substrate to the package substrate;
- a first semiconductor chip and a second semiconductor chip horizontally spaced apart from each other on the interposer substrate;
- second connection bumps between the interposer substrate and the first and second semiconductor chips, the second connection bumps connecting the first and second semiconductor chips to the interposer substrate; and
- an upper molding layer on the interposer substrate, the upper molding layer at least partially surrounding the first semiconductor chip and the second semiconductor chip,
- wherein the interposer substrate includes:
  - a plurality of sub-interposers horizontally spaced apart from each other and each including through electrodes extending therethrough;
  - a lower molding layer in a space between the sub-interposers; and
  - a redistribution layer electrically connected to the through electrodes on the sub-interposers and the lower molding layer,
- wherein a sum of areas of top surfaces of the sub-interposers is less than a sum of an area of a bottom surface of the first semiconductor chip and an area of a bottom surface of the second semiconductor chip.

2. The semiconductor package of claim 1, wherein the first semiconductor chip and the second semiconductor chip are electrically connected to the package substrate through the redistribution layer and the through electrodes.

3. The semiconductor package of claim 1, wherein a horizontal spacing between the first semiconductor chip and the second semiconductor chip is in a range of about 1 μm to about 200 μm.

4. The semiconductor package of claim 1, wherein each of the first semiconductor chip and the second semiconductor chip vertically overlaps at least two of the sub-interposers.

5. The semiconductor package of claim 1, wherein
- the plurality of sub-interposers comprises first sub-interposers each of which vertically overlap the first semiconductor chip and has an area less than the area of the first semiconductor chip, and
- the plurality of sub-interposers comprises second sub-interposers each of which vertically overlap the second semiconductor chip and has an area less than the area of the second semiconductor chip.

6. The semiconductor package of claim 1, wherein
- the first semiconductor chip includes a memory chip, and
- the second semiconductor chip includes a logic chip.

7. The semiconductor package of claim 1, wherein
- a top surface of each of the sub-interposers is coplanar with a top surface of the lower molding layer, and
- the top surface of each of the sub-interposers and the top surface of the lower molding layer are in contact with a bottom surface of the redistribution layer.

8. The semiconductor package of claim 1, wherein the plurality of sub-interposers comprises at least one sub-interposer that vertically overlaps at least a portion of the first semiconductor chip and at least a portion of the second semiconductor chip.

9. The semiconductor package of claim 1, wherein the sub-interposers are silicon interposers.

10. A semiconductor package, comprising:
- a substrate including sub-interposers, a lower molding layer, and a redistribution layer;
- first connection bumps on a bottom surface of the substrate; and
- a first semiconductor chip and a second semiconductor chip mounted on the substrate and horizontally spaced apart from each other,
- wherein the lower molding layer is between the sub-interposers that are horizontally spaced apart from each other,
- wherein top surfaces of the sub-interposers are exposed at a top surface of the lower molding layer,
- wherein bottom surfaces of the sub-interposers are exposed at a bottom surface of the lower molding layer,
- wherein a sum of areas of the top surfaces of the sub-interposers is less than a sum of an area of a bottom surface of the first semiconductor chip and an area of a bottom surface of the second semiconductor chip,
- wherein the redistribution layer covers the top surfaces of the sub-interposers and the top surface of the lower molding layer,
- wherein each of the sub-interposers includes through electrodes that vertically penetrate the sub-interposer and are coupled to the redistribution layer, and
- wherein a horizontal spacing between the first semiconductor chip and the second semiconductor chip is in a range of about 1 μm to about 200 μm.

11. The semiconductor package of claim 10, wherein the substrate is electrically connected to the first semiconductor chip and the second semiconductor chip by the through electrodes.

12. The semiconductor package of claim 10, wherein at least some of the sub-interposers are vertically aligned with at least a portion of the first semiconductor chip and at least a portion of the second semiconductor chip.

13. The semiconductor package of claim 10, wherein each of the first semiconductor chip and the second semiconductor chip is vertically aligned with at least two of the sub-interposers.

14. The semiconductor package of claim 10, wherein the top surface of each of the sub-interposers is coplanar with the top surface of the lower molding layer, and the top surface of each of the sub-interposers and the top surface of the lower molding layer are in contact with a bottom surface of the redistribution layer.

15. The semiconductor package of claim 10, wherein among the sub-interposers, an area of each of sub-interposers that vertically overlap the first semiconductor chip is less than an area of the first semiconductor chip, and among the sub-interposers, an area of each of sub-interposers that vertically overlap the second semiconductor chip is less than an area of the second semiconductor chip.

16. The semiconductor package of claim 10, further comprising:

first connection bumps on the bottom surface of the substrate;

a package substrate including a top surface to which the first connection bumps are coupled;

external connection terminals on a bottom surface of the package substrate; and an upper molding layer on the substrate, the upper molding layer surrounding side surfaces of the first semiconductor chip and the second semiconductor chip.

17. A semiconductor package, comprising:

a package substrate;

an interposer substrate on the package substrate, the interposer substrate including sub-interposers, a molding layer at least partially surrounding the sub-interposers, and a redistribution layer covering top surfaces of the sub-interposers and a top surface of the molding layer; and a first semiconductor chip and a second semiconductor chip on the interposer substrate, wherein a sum of areas of the top surfaces of the sub-interposers is less than a sum of an area of a bottom surface of the first semiconductor chip and an area of a bottom surface of the second semiconductor chip, wherein the sub-interposers are horizontally spaced apart from each other with the molding layer in spaces between the sub-interposers, wherein each of the sub-interposers includes through electrodes penetrating the sub-interposer and connecting to the redistribution layer, and wherein the package substrate is electrically connected to the first semiconductor chip and the second semiconductor chip through the redistribution layer.

18. The semiconductor package of claim 17, wherein a spacing between the first semiconductor chip and the second semiconductor chip is in a range of about 1 μm to about 200 μm.

* * * * *